(12) United States Patent
Liao

(10) Patent No.: US 7,429,181 B2
(45) Date of Patent: Sep. 30, 2008

(54) ELECTRICAL CONNECTOR ASSEMBLY HAVING IMPROVED PICKUP CAP

(75) Inventor: Fang-Jwu Liao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/709,036

(22) Filed: Feb. 20, 2007

(65) Prior Publication Data

US 2007/0202718 A1 Aug. 30, 2007

(30) Foreign Application Priority Data

Feb. 27, 2006 (TW) ............................. 95106506 A

(51) Int. Cl.
*H01R 13/44* (2006.01)

(52) U.S. Cl. ..................................................... 439/135

(58) Field of Classification Search ................ 439/135, 439/331, 940, 71, 41
See application file for complete search history.

(56) References Cited

U.S. PATENT DOCUMENTS

| | | | | |
|---|---|---|---|---|
| 4,017,137 A | * | 4/1977 | Parks | 439/135 |
| 5,603,642 A | * | 2/1997 | Shinji et al. | 439/752 |
| 2004/0166710 A1 | * | 8/2004 | Ma | 439/135 |

* cited by examiner

*Primary Examiner*—Javaid Nasri
(74) *Attorney, Agent, or Firm*—Wei Te Chung

(57) ABSTRACT

An electrical connector assembly comprises an electrical connector (2), a pick up cap (3) for engaging with the electrical connector (2). The electrical connector (2) comprises a housing (21), a plurality of terminals received in the housing (21). The housing (21) defines an opening (22) in a central position thereof and a pair of securing recesses (211) on two lateral sides of the housing (2) adjacent to the opening (22). The pick up cap (3) defines a smooth vacuum suction portion (32) in a central position thereof and a pair of rectangular holes (34) arranged on two sides of the vacuum suction portion (32), a pair of beams (35) disposed on sidewalls of the base portion adjacent to the holes (34). The beam (35) extends downwardly a pair of elastic hooks (31). The elastic hooks (31) engage with the securing recesses (211) of the base portion respectively.

2 Claims, 6 Drawing Sheets

ELECTRICAL CONNECTOR ASSEMBLY HAVING IMPROVED PICKUP CAP

BACKGROUND OF THE INVENTION

The present invention claims the foreign priority of TW patent application Serial No. 95106506, filed on Feb. 27, 2006, which have the same applicant and assignee as the present invention.

1. Field of the Invention

The present invention relates to the art of an electrical connector assembly having a pick up cap, and more particularly to an electrical connector assembly provided for electrically connecting a chip module to a printed circuit board (PCB).

2. Description of the Prior Art

Referring to FIG. 5-6, an electrical connector assembly is widely used in the connector industry for electrically connecting a chip module to a printed circuit board (PCB) in personal computer comprises an electrical connector 2' and a pick up 3'. The pick up cap 3' is mounted onto the connector 2' for providing a plane surface to be engaged by a vacuum suction device. The electrical connector 2' comprises a housing 21' received a plurality of terminals, a stiffener 22' covered on the housing, a cover 24' and a lever 25' mounted on two sides on the housing 21'. The cover 24' is a hollow frame and comprises a cavity 240' in a center position thereof, a first bilateral side 241', a second bilateral side 242', a third bilateral side 243' and a fourth bilateral side 244' surrounding the cavity 240'. The pick up 3' is a rectangular shape and defines a smooth sucking portion 33' for being picked up by a vacuum suction device. The pick up 3' defines a first end 31' and a second end 32' opposite to the first end 31', a third end 37' and a fourth end 38' opposite to the third end 37'. The first end 31' defines a first projection 312' extending from a lateral side thereof and the second end 32' defines a second projection 322' extending from a lateral side thereof. The third end 37' defines a pair of first hooks 372' extending outwardly from two opposite lateral sides thereof and the fourth end 38' defines a pair of second hooks 382' extending outwardly from two opposite lateral sides thereof. In addition, the first end 31' and the second end 32' each define a pair of stop ribs 39' extending from two sides of the projections thereof. When the pick up 3' is assembled on the electrical connector 2', each second hook of 382' the pick up 3' passes through the center opening 240' of the cover 24' and engages with an inner wall of the first lateral side 241'. Successively, the first hook 372' is secured on an inner wall of the second lateral side 242'. At last, the stop rib 39' of the pick up 3' are inserted into the central opening 240' and abuts against the inner wall of the third lateral side 243' and the fourth lateral side 244' respectively.

However, in above statement, the electrical connectors define hooks on the outer sides thereof, which are engaged with pick up caps in a rigid interferential engagement means. When the electrical connector assembly is assembled or disassembled, the force applied on the pick up cap and the electrical connector has to be greater than ever, which is prone to destroy the hooks of the pick up cap and the parts of the electrical connector. In addition, the greater shake during the assembling the pick up cap on the electrical connector can make an open electrical connection and a fail mechanical connection between terminals and leads of the chip module.

Thus, there is a need to provide a new land grid connector assembly that overcomes the above-mentioned problems.

SUMMARY OF THE INVENTION

Accordingly, an object of the present invention is to provide an electrical connector assembly, which has an electrical connector and a pick up cap mounted onto the connector, wherein the pick up cap is configured to facilitate detachment of the pick up cap from the connector and ensure a stably and reliably connection between the pick up and the electrical connector.

To fulfill the above-mentioned object, an electrical connector assembly in accordance with a preferred embodiment comprises an electrical connector, a pick up for engaging with the electrical connector. The electrical connector comprises a housing, a plurality of terminals received in the housing. The housing defines an opening in a central position thereof and a pair of securing recesses on two lateral sides of the housing adjacent to the opening. The pick up defines a smooth vacuum suction portion in a central position thereof and a pair of rectangular holes arranged on two sides of the vacuum suction portion, a pair of beams disposed on sidewalls of the base portion adjacent to the holes. The beams extend downwardly a pair of elastic hooks. The elastic hooks engage with the securing recesses of the base portion respectively. In addition, the base portion further defines a pair of locating protrusions projected downwardly.

Relative to the present technology, the pick up is mounted on the electrical connector by an elastic engagement. As a result, when assembled or disassembled, the force used for assembly can decrease, hence the hooks of the pick up are not prone to be destroyed and the electrical connection between the terminals and the leads of the chip module is more stable than ever.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
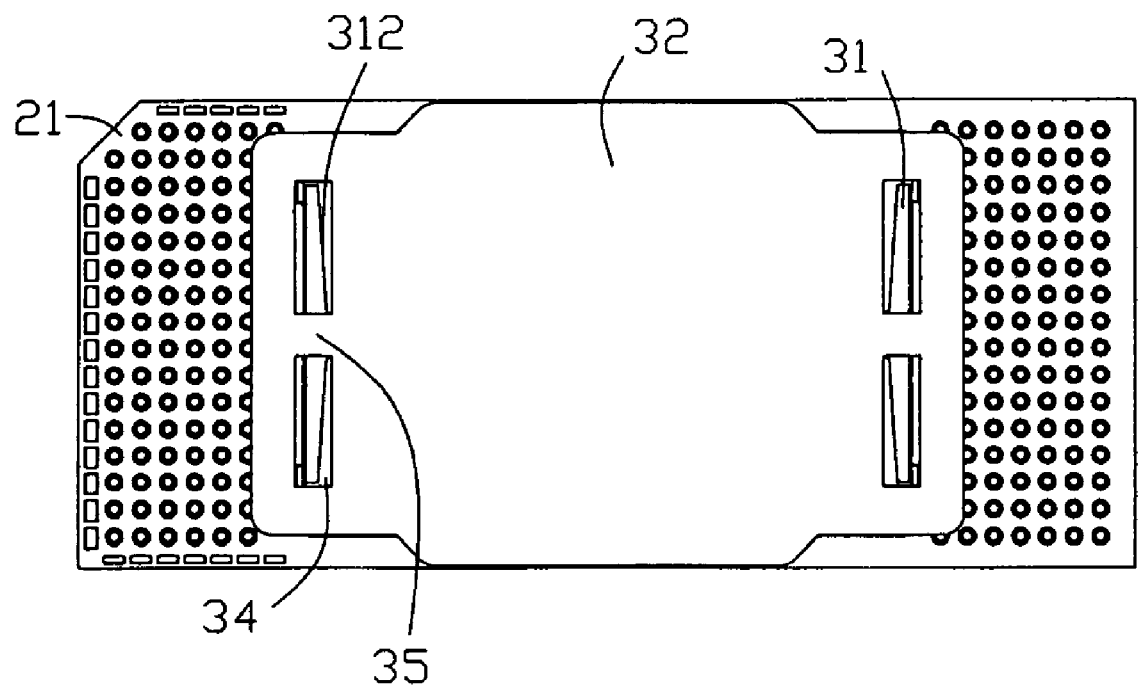
FIG. 1 is an assembled, isometric view of an electrical connector assembly in accordance with a preferred embodiment of the present invention.
Figure 2:
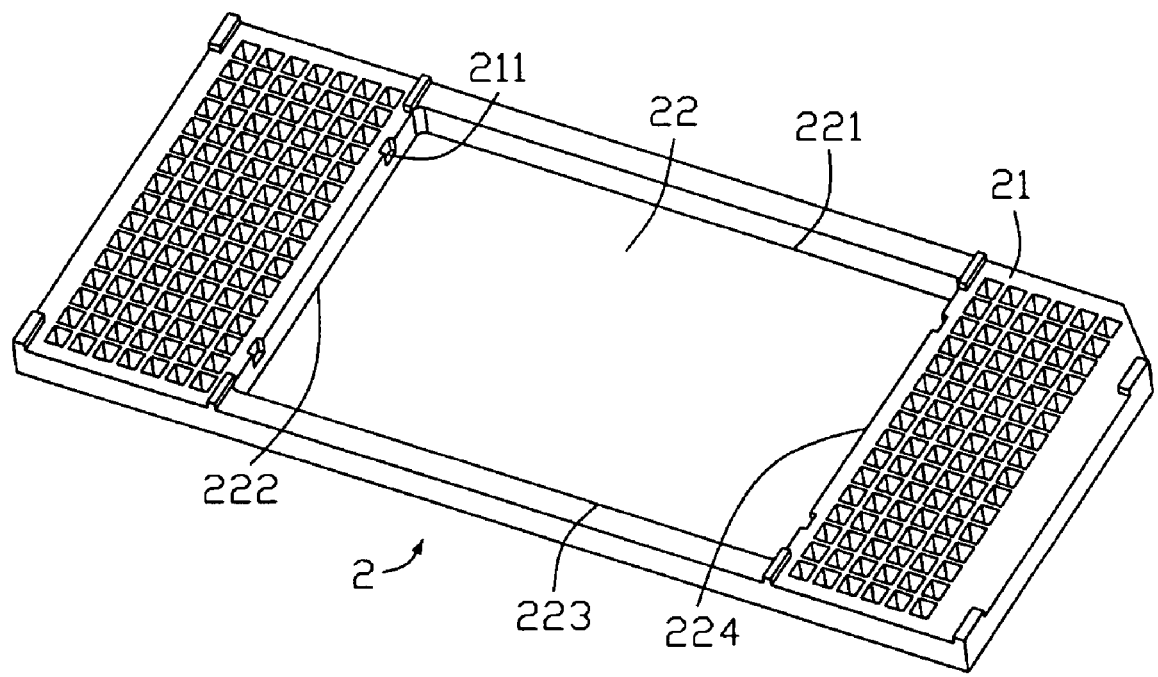
FIG. 2 is an exploded, isometric view of FIG. 1.
Figure 2:
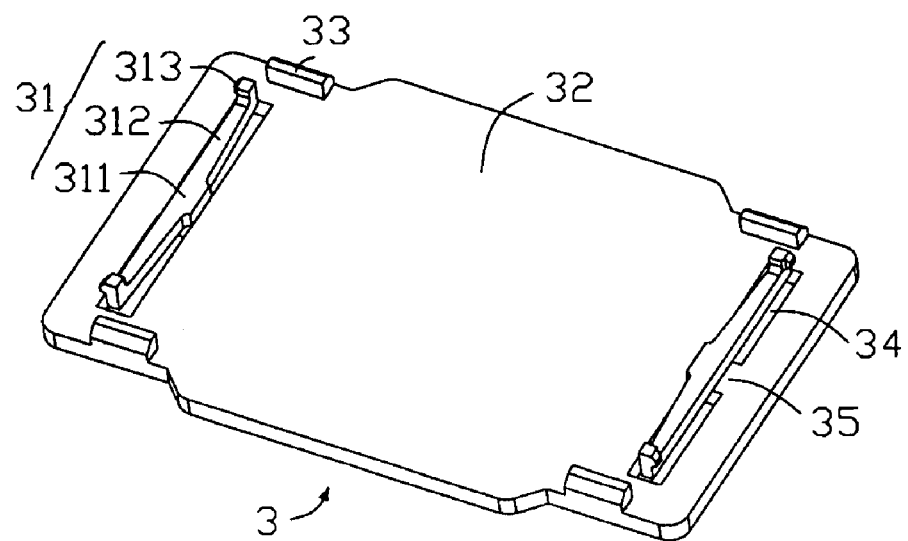
Figure 3:
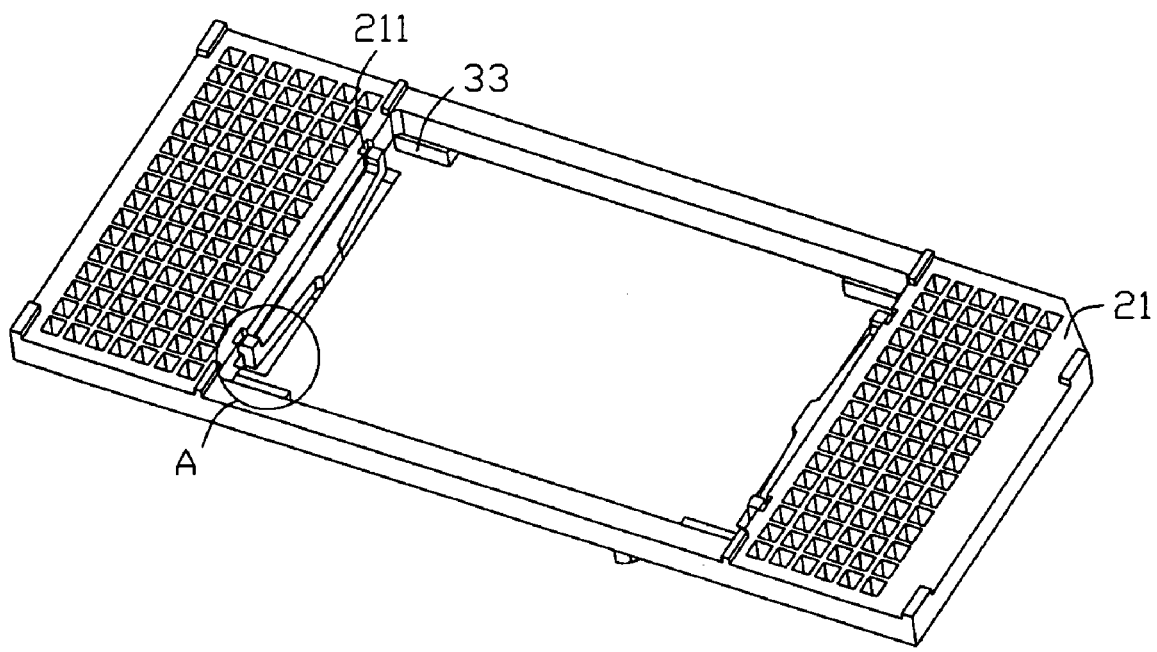
FIG. 3 is an other perspective view of FIG. 1.
Figure 4:
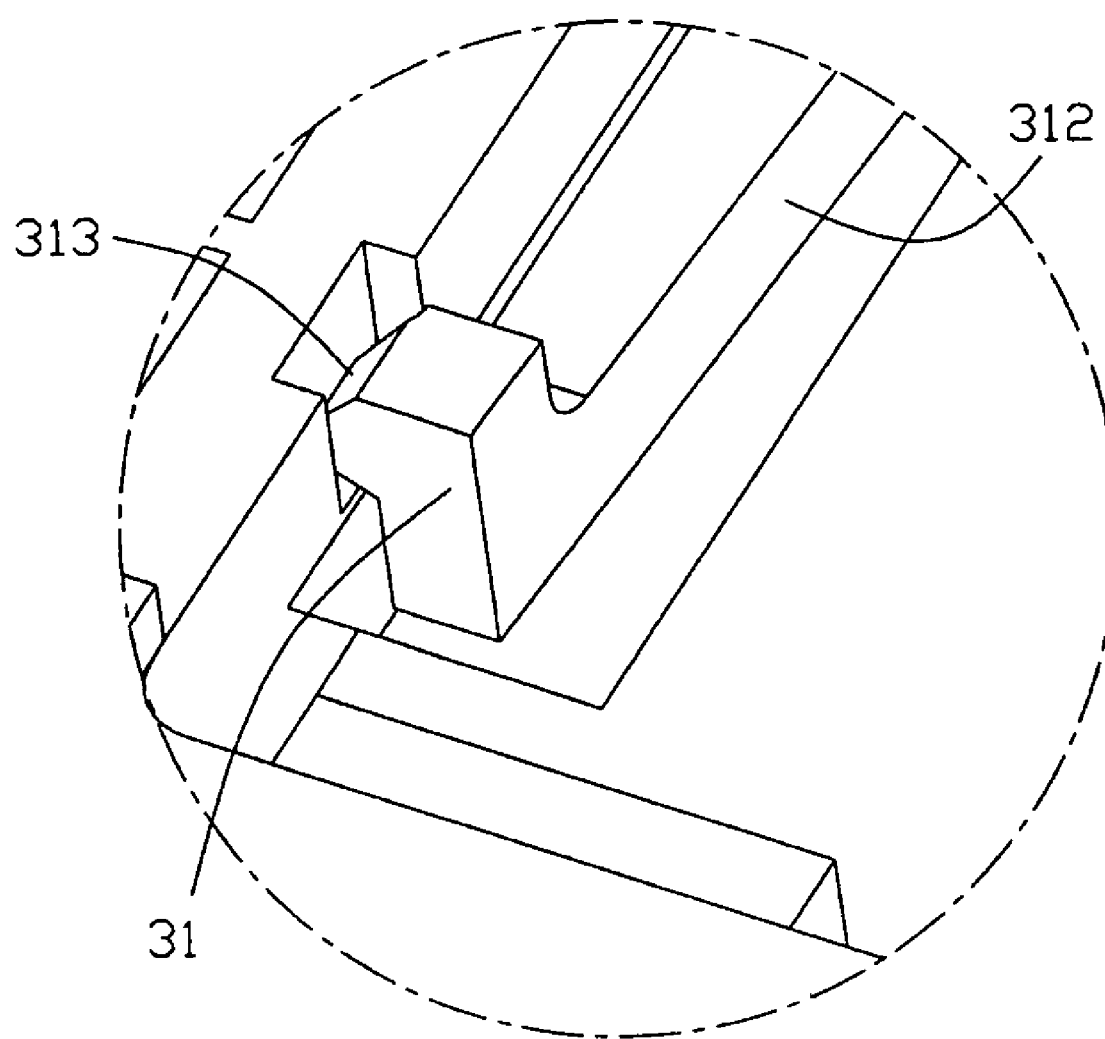
FIG. 4 is amplified view of a engaging position between a pick up and a housing showing in FIG. 1.
Figure 5:
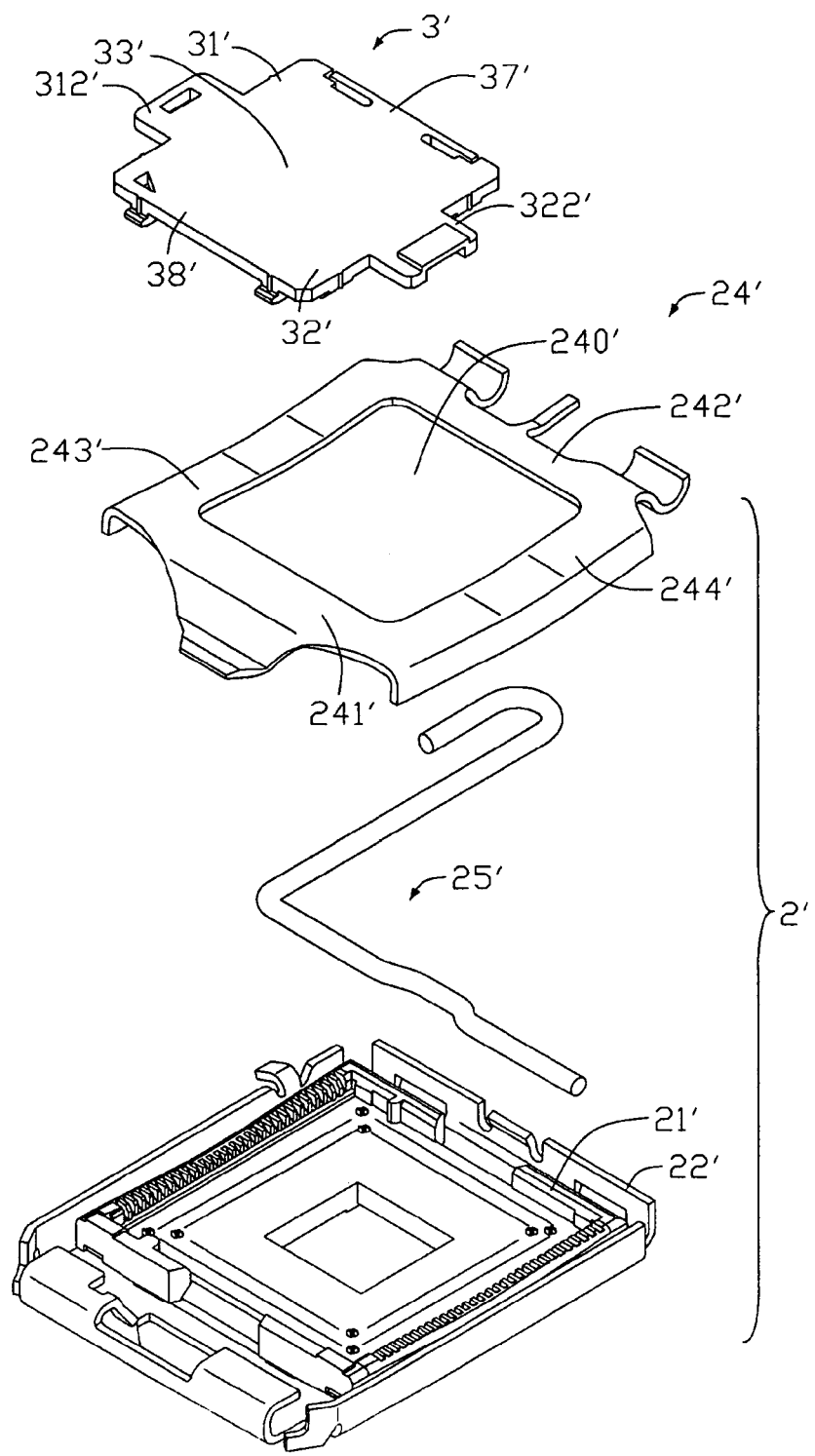
FIG. 5 an explosive, isometric view of a conventional electrical connector assembly relative to the invention.
Figure 6:
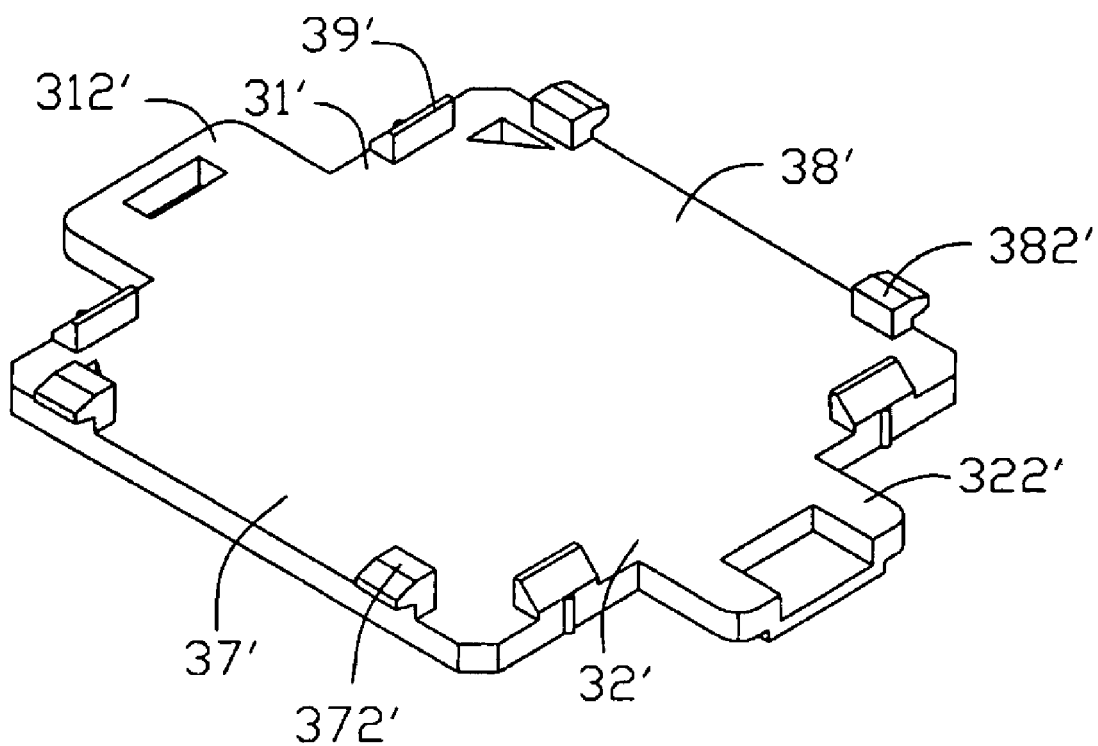
FIG. 6 an amplified view of a pick up of the conventional electrical connector assembly disclosed in FIG. 5.

Referring to FIG. 1, an electrical connector assembly in accordance with a preferred embodiment of the present invention comprises an electrical connector 2 and a pick up cap 3 mounted onto the connector 2, for providing a plane top surface to be engaged by a vacuum suction device. The connector assembly can thereby be moved onto a circuit substrate, such as a printed circuit board (PCB) (not shown), on which the connector 2 is to be mounted.

The electrical connector 2 comprises a housing 21 and a plurality of terminals received in the housing 21. The housing 21 is rectangular-shaped and comprises a rectangular opening 22 in a central portion thereof and a plurality of passageways for receiving the terminals therein and a first lateral side 221, a second lateral side 222, a third lateral side 223 and a fourth lateral side 224 defined around the opening 22. The second lateral side 222 and the fourth lateral side 224 define a pair of securing recesses 211 respectively.

The pick up cap 3 comprises a pair of opposite first ends 30 and a pair of second ends 31 opposite to the first ends 30, a smooth vacuum suction portion 32 in a central portion thereof for engaging with a vacuum suction device, a pair of through holes 34 arranged on two ends thereof respectively, a pair of beams 35 defined on two inner walls adjacent to the hole 34. The beam 35 defines an elastic hooks 31 extending outwardly. The elastic hook 31 comprises a connecting portion 311, an elastic portion 312, a hooking portion 313 with a wedge-shaped surface. The elastic hooking portion 313 extends towards the first end 30 opposite to the vacuum suction portion 32. The second end 31 defines downwardly a pair of locating protrusions 33 on two lateral sides thereof.

When the pick up cap 3 is assembled on the electrical connector 2, the elastic hooks 31 are inserted into the central opening 22 of the housing 2 and engage with securing recess 211 of the second lateral side 222 and fourth lateral side 224. In this state, the locating protrusion 33 of the pick up 2 is inserted into the central opening 22 and abuts against the inner wall of the first lateral side 221 and the third lateral side 223. Then, the pick up is accurately mounted on the electrical connector. So the elastic hook 31 disposed on the pick up cap 3 secure the pick up 3 on the electrical connector 2, which resolves a problem about a rigid engagement of the conventional technology, simplifies an assembling process and ensures a sure connection between terminals and the chip module.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. An electrical connector assembly comprising: an insulative housing defining a central opening surrounded by a peripheral wall; at least a recess formed in an inner face of the peripheral wall; a pick-up cap forming a flat main body having a periphery with a planar upper face for being sucked by a vacuum suction device and an opposite lower face, a pair of resilient arms extending without beyond said periphery thereof; wherein said pair of resilient arm is equipped with a locking lug around a distal end to be engageably received in the recess; wherein there are two of said recess in a same face of the peripheral wall, and the pair of resilient arm is linked to the main body around a middle portion thereof; wherein there are two of said lug located around two opposite end of the pair of resilient arm.

2. An electrical connector assembly comprising:
an insulative housing defining a central opening surrounded by a peripheral wall;
at least a recess formed in an inner face of the peripheral wall; and a unitary pick-up cap forming flat main body with a planar upper face for suction and a resilient arm horizontally deflectably extending along a first direction under the main body; wherein
said resilient arm is equipped with a locking lug located around a distal end and extending along a second direction, which is perpendicular to the first direction, to be engageably received in the recess; wherein
said resilient arm extends along and proximate an edge of said pick-up cap while the resilient arm and the associated locking lug are still located within a periphery defined by said edge for protection consideration.

\* \* \* \* \*